United States Patent
Malpuech et al.

(10) Patent No.: US 8,498,318 B2
(45) Date of Patent: Jul. 30, 2013

(54) LIGHT EMITTING SYSTEM ACCORDING TO A POLARITON MODE WITH ELECTRICAL INJECTION OF QUANTUM WELLS

(75) Inventors: Guillaume Malpuech, Manson (FR); Dmitry Solnyshkov, Chamalieres (FR); Aldo Di Carlo, Rome (IT); Eleonora Petrolati, Rome (IT)

(73) Assignee: Centre National de la Recherche Scientifique - CNRS, Paris (FR)

( * ) Notice: Subject to any disclaimer, the term of this patent is extended or adjusted under 35 U.S.C. 154(b) by 66 days.

(21) Appl. No.: 13/128,765

(22) PCT Filed: Oct. 29, 2009

(86) PCT No.: PCT/FR2009/001257
§ 371 (c)(1),
(2), (4) Date: Jul. 14, 2011

(87) PCT Pub. No.: WO2010/055221
PCT Pub. Date: May 20, 2010

(65) Prior Publication Data
US 2011/0261851 A1    Oct. 27, 2011

(30) Foreign Application Priority Data
Nov. 13, 2008    (FR) .................................... 08 06323

(51) Int. Cl.
*H01S 5/00*    (2006.01)
(52) U.S. Cl.
USPC ................. 372/43.01; 372/44.01; 372/50.1; 372/50.124
(58) Field of Classification Search
USPC .................. 372/43.01, 44.01, 50.1
See application file for complete search history.

(56) References Cited

U.S. PATENT DOCUMENTS

| | | | |
|---|---|---|---|
| 5,877,509 A | 3/1999 | Pau et al. | |
| 6,931,042 B2 * | 8/2005 | Choquette et al. | 372/43.01 |
| 7,583,714 B2 * | 9/2009 | Nakahara et al. | 372/45.01 |

FOREIGN PATENT DOCUMENTS
WO    2005/088786 A1    9/2005

OTHER PUBLICATIONS

G. Christmann et al.: Applied Physics Letters, vol. 93, No. 051102, Aug. 4, 2008, pp. 051102-1-051102-3, XP002539432, Cited in the application and ISR.

Weihs G. et al.: "Exciton-polariton lasing in a microcavity", Semiconductor Science and Technology, IOP, Bristol, GB, vol. 18, No. 10, Oct. 1, 2003, pp., S386-S394, XP002352635, ISSN: 0268-1242, Cited in ISR.

(Continued)

*Primary Examiner* — Dung Nguyen
(74) *Attorney, Agent, or Firm* — Young & Thompson

(57) ABSTRACT

A light (2) emitting system (1) includes an optical cavity (10) having at least one optical mode and including at least one transmissive reflector (12), a first set (20) of quantum wells (21, 22) and elements (31, 32, 33) of electrical injection of the quantum wells of the first set. The quantum wells of the first set are arranged so that at least one of their electronic resonances is a strong coupling regime with an optical mode of the optical cavity and emits a light according to a mixed excitonpolariton mode. The optical cavity further includes a second set (40) of quantum wells (41, 42, 43, 44, 45) arranged outside of the direct range of the elements of electrical injection and arranged in relation to the quantum wells of the first set so that at least one of their electronic resonances is in a strong coupling regime with the mixed exciton-polariton mode of the optical cavity.

14 Claims, 2 Drawing Sheets

OTHER PUBLICATIONS

Petrolati et al.: "Simulation of exciton formation and transport in electrically driven polariton laser structures", Superlattices and Microstructures, Academic Press, London, GB, vol. 41, No. 5-6, Jun. 11, 2007, pp. 364-367, XP022111939, ISSN: 0749-6036, Cited in ISR.

S. I. Tsintzos et al.: "A GaAs polariton light-emitting diode operating near room temperature", vol. 453, May 15m 2008, pp. 372-375, XP002539433, Cited in the application and ISR.

A. A. Khalifa et al.: "Electroluminescence emission from polariton states in GaAs based semiconductor microcavities", Aplied Physics Letters, vol. 92, No. 061107, Feb. 13, 2008, pp. 061107-1-061107-3, XP002539434, Cited in ISR.

D. Solnyshkov et al.: "Theory of an electrically injected bulk polariton laser", Applied Physics Letters, vol. 94, No. 011110, Jan. 6, 2009, pp. 011110-1-011110-3, XP002539435, Cited in ISR.

R. Butte et al.: "Room temperature polariton lasing in III nitride microcavities a comparison with blue GaN-based vertical cavity surface emitting lasers", Proceedings of the SPIE, The International Society for Optical Engineering, No. 7216, Jan. 26, 2009, pp. 721619-1-721619-16, XP002539436, Cited in ISR.

International Search Report, dated Mar. 8, 2010, from corresponding PCT application.

* cited by examiner

LIGHT EMITTING SYSTEM ACCORDING TO A POLARITON MODE WITH ELECTRICAL INJECTION OF QUANTUM WELLS

This invention relates to a light emitting system according to a polariton mode with electrical injection of quantum wells.

TECHNICAL FIELD

This invention relates to the field of semiconductor light sources using quantum well structures for the purposes of obtaining an effect of the "polariton laser" type.

It relates more particularly to a light emitting system comprising an optical cavity having at least one optical mode and comprising at least one transmissive reflector, a first set of quantum wells and means of electrical injection of these quantum wells of the first set. The quantum wells of the first set are arranged in such a way that at least one of their electronic resonances is a strong coupling regime with an optical mode of said optical cavity and emits a light according to a mixed exciton-polariton mode.

PRIOR ART

Semiconductor lasers are used to produce monochromatic and intense light beams. They are pumped using an electric current circulating in a P—N junction which makes it possible to enrich an optical cavity with electrons on one side and with holes on the other side. A light beam is then produced on the junction by recombining holes and electrons. The operation of the laser is subordinated to the realization of the population inversion condition, which means that the emission of light due to the recombination of the electron-hole pairs must be greater than the absorption, which is due to the creation of these electron-hole pairs. This condition determines in part the operating threshold of semiconductor lasers, i.e. the minimum intensity of the electric current circulating in the junction so that the laser can operate. A disadvantage with these lasers resides in the fact that they have a rather high emission threshold, which results in a loss of energy via heating, and in certain cases, great difficulty, and even the impossibility of obtaining the laser effect.

The polariton laser makes it possible to overcome such a threshold. It is based on the Bose-Einstein condensation principle of exciton-polaritons, which are quasi-particles of the exciton-photon type existing in the planar micro-cavities in a strong coupling regime. This device is commonly referred to as "laser" because it emits a light beam comparable to that of a laser. However, it is based on a different operating principle, i.e. the condensation of exciton-polaritons, not the stimulated emission of photons. As such, the population inversion condition, responsible for the threshold in a conventional laser, does not have to be satisfied for a polariton laser, which intrinsically makes it a very low threshold laser. This makes it possible, furthermore, to integrate it into microcircuits and to increase the lifetime of the batteries of portable devices. The operating principle of a polariton laser was proposed for the first time in the publication "Phys. Lett. A 214; 193, 1996" and has since been studied in many articles, of which for example publication "Phys. Rev. Lett. 101, 146404 (2008)".

In order to realize a polariton laser that is viable commercially, it is necessary to manufacture an electrically injected polariton laser, which has never been done, and it is preferable to operate it at room temperature. For this second aspect, semiconductors having stable excitons at room temperature, such as materials in the GaN family can be used, as described in the publications "Phys. Rev. Lett. 98, 126405 (2007)", "Phys, Rev. Lett. 101, 406409 (2008))" and "Appl. Phys. Lett. 93, 051102 (2008)".

It is possible to realize micro-cavities of which the active layer is constituted of volume material for which the polariton laser effect under optical pumping has been observed, as described in the publication "Phys. Rev. Lett. 101, 406409 (2008)". Another solution consists in realizing a microcavity comprising an active layer constituted of quantum wells, which in principle makes it possible to reduce the threshold by a factor of 10 in relation to that obtained for a volume structure. The quantum wells are planar structures able to confine the movement of electrons and of holes according to a direction in space and to leave it free in the other two directions. This confinement is discrete, which gives rise to bands of energy of which the energy values are according to the dimensions of the quantum wells as well as intrinsic properties of the materials that they are comprised of. They can be manufactured in particular by epitaxy via molecular beam or via chemical vapor deposition.

Other particles such as excitons can be affected in a similar manner by the quantum wells. The choice of the geometry and of the material constituting the quantum wells makes it possible to define levels of energy for the electrons, the excitons, the holes, and others. These particles can be displaced between the levels of energy and consequently emit and absorb photons with certain energies.

A quantum well polariton structure is described in patent documents EP 1 729 383 and EP 1 813 981. In the latter document, an emitting system comprises a substrate whereon are successively deposited a first Bragg reflector, two semiconductive layers surrounding a quantum well, and finally a second Bragg reflector. The whole as such forms a microoptical cavity wherein is arranged a quantum well. The microcavity formed as such can spatially locate a polariton and include at least three discrete energy levels for polaritons.

Another structure is described in U.S. Pat. No. 5,877,509. In this document, a light emitting system comprises a resonant optical micro-cavity, a single quantum well and means of resonant transport. The optical cavity comprises two Bragg reflectors of which one is transmissive, an N-doped and P-doped region and an undoped gap region. The quantum well is arranged inside the optical cavity, in such a way as to provide at least one level of energy for electrons, excitons, holes and polaritons. The level of energy for polaritons is obtained when the energy of a photon is sufficiently close to the energy of the level of energy for excitons. Light emitting systems using polariton states, based on micro-cavities with multi-quantum wells have already been realized, such as disclosed in publications "Appl. Phys. Letters 92, 061107 (2008)", "Phys. Rev. B 77, 113303 (2008)", "Phys. Rev. Letters 100, 136806 (2008)" and "Nature 453, 372 (2008)".

Nevertheless, the structures described hereinabove make it possible to realize a function of the light-emitting diode type. They do not make it possible to obtain the polariton laser effect. The latter in order to be realized requires the use of structures containing a high number of quantum wells coupled together via the polariton mode, in order to maximize the light-matter coupling and facilitate the Bose-Einstein condensation of the polaritons. As such, the main additions of polariton laser effects were obtained, under optical pumping, with the materials in the GaAs family with structures containing 12 quantum wells (publication "Science 316, 1007 (2007)"), 26 quantum wells in CdTe (publication "Nature 443, 409 (2006)") and 67 in GaN (publication "Appl. Phys. Lett. 93, 051102 (2008)"). The use of a large number of wells nevertheless has the disadvantage of making more difficult, and even impossible, the electrical injection of the wells.

Then, the problem arises with the electrical injection of quantum wells. Indeed, on the one hand, an efficient and homogeneous injection requires a small number of quantum wells in the active zone. This can be explained by the fact that the electrons arrive on one side and the holes on the other side. As the latter must pass through all of the quantum wells in order to meet, the injection is made further difficult when there are quantum wells between the electrons and the holes.

Moreover, it appears highly favorable for marketing to realize a component operating at room temperature. As was previously said, the best developed solutions consist in using planar micro-cavities realized from large-gap semiconductors such as for example the GaN family. In this type of structure the polariton laser effect, under optical pumping was added. In addition, gallium nitride allows for an emission in ultraviolet around 350 nanometers, wavelength range where the realization of a laser with semiconductors remains complicated.

In the case of the use of materials from the GaN family, the problems of homogeneity of the electrical injection are crucial as the mobility of the holes is much weaker than that of the electrons. Typically, it is difficult to efficiently inject a number of quantum wells greater than a few units. On the other hand, a polariton laser must contain a large number of quantum wells as was previously said. The single addition of the polariton laser effect at 300 K in a structure with GaN quantum wells was for a structure containing 67 quantum wells (publication "Appl. Phys. Lett. 93, 051102 (2008)").

This contradiction between the electrical injection, requiring few wells, and the obtaining of the polariton laser effect, requiring the most wells possible, makes unusable the geometries that are currently used for semiconductor lasers or optically pumped polariton lasers for the realization of an electrically pumped polariton laser.

As such, no solution of prior art makes it possible to realize an efficient system for the emission of monochromatic and intense light according to a polariton mode by electrical injection of quantum wells.

OBJECT OF THE INVENTION

The object of this invention is to overcome this technical problem, by proposing to insert into an optical cavity a sufficient quantity of quantum wells in order to be able to observe the polariton laser effect, but also a particular arrangement allowing for an efficient electrical pumping of this structure. Among all of the inserted quantum wells, only one portion is arranged in such a way as to undergo an electrical injection, which ensures that the injection takes place in good conditions in these wells. The other portion of the set of quantum wells is arranged in such a way as to not undergo this electrical injection in a direct way. Nevertheless, all of the wells participate in the strong coupling regime, and the electrically injected wells are optically coupled to the other wells, via the existence of the extended polariton mode of the microcavity.

The injected quantum wells will then emit photons in the polariton mode, wherein participates all of the quantum wells. These photons will be absorbed by the quantum wells that are not directly pumped. The process of emitting photons via the injected wells, then of absorbing by the other wells is very fast in a strong coupling regime, typically two orders of magnitude shorter than in a weak coupling regime. This is the polariton effect. This technique as such makes it possible to electrically inject, in an efficient manner polaritons into a microcavity having a large number of quantum wells that are strongly coupled with the optical mode.

The condensation of polaritons in their lowest energy state is greatly facilitated when the number of quantum wells that are strongly coupled is high. The invention therefore makes it possible to electrically inject polaritons in this type of structure. The spontaneous radiative decay of the polariton condensate results in the emission of a monochromatic and intense light beam, emission made possible by the finite transmissivity of one of the reflectors.

The approach of the solution consisted in searching how to exploit the strong coupling regime required for the obtaining of a polariton effect. It then appeared that in using this coupling regime in order to cause interaction of the quantum wells injected electrically—in order to obtain an emission of photons according to a polariton mode—with non-injected quantum wells, it was possible to inject only a low number of wells, with the rest of the wells able to be optically pumped by the absorption of the photons, these wells optically pumped then reemitting photons directly according to the same polariton mode.

This approach is even further inventive in the sense that it cannot be applied to a conventional laser. Indeed, non-electrically pumped wells cannot lead to a population inversion. They simply absorb the light, which destroys the laser effect. On the contrary, for a polariton laser, the absorption of the light is exactly what is sought and exploited in order to optically couple the wells pumped with the non-electrically pumped wells.

With this purpose, the invention has for object a light emitting system comprising an optical cavity having at least one optical mode and comprising at least one transmissive reflector, a first set of quantum wells and means of electrical injection of these quantum wells of the first set. The quantum wells of the first set are arranged in such a way that at least one of their electronic resonances is a strong coupling regime with an optical mode of said optical cavity and emits a light according to a mixed exciton-polariton mode. In this system, the optical cavity further comprises a second set of quantum wells arranged outside of the direct range of the means of electrical injection and arranged in relation to said quantum wells of the first set in such a way that at least one of their electronic resonances is in a strong coupling regime with said mixed exciton-polariton mode of said optical cavity.

Those skilled in the art shall understand here that the quantum wells of the second set are not injected electrically in a direct way, but only absorb and reemit the photons emitted by the quantum wells of the first set thanks to their coupling via a polariton mode.

Those skilled in the art will also understand that the emission of photons outside of the cavity, and therefore the generation of monochromatic and intense light beam is due to the spontaneous radiative decay of the polariton condensate.

This solution advantageously combines the obtaining of the strong coupling regime and the forming of a polariton mode with an original arrangement of the quantum wells. The emission of photons according to this polariton mode makes it possible to optically pump the wells not injected electrically by absorption of these photons, then reemission of the latter according to the same polariton mode. A system is then obtained comprising an resonant optical cavity wherein a plurality of quantum wells are inserted and all participate in the polariton effect in such a way as to obtain a quantum efficiency that is further higher. Furthermore, the low number of quantum wells injected electrically favors the obtaining of the polariton laser effect by decreasing the screening and phase shift phenomena in the non-electrically pumped wells.

According to a particular embodiment, the light is emitted in the form of a directional and monochromatic light beam, as such constituting a so-called "polariton laser".

More preferably, the first set comprises a number of quantum wells that is rather less than 5, which makes it possible, due to the low number of wells to be injected, to have a homogeneous electrical injection.

More preferably, the first set comprises a number of quantum wells that is substantially lower than the number of quantum wells in the second set. As such, as these quantum wells of the second set are strongly coupled to those of the first set (injected electrically), the polariton laser effect obtained with such a number of wells will be even further substantial.

More preferably, the quantum wells of the first and of the second set are identical.

More preferably, the optical cavity comprises a bottom reflector and a top reflector arranged respectively at the lower and upper ends of this optical cavity. The top reflector is transmissive in such a way that the light emitted by the system passes through this top reflector.

According to a particularly advantageous alternative, the reflectors of the optical cavity are Bragg reflectors, which have the advantage of giving rise to very low optical loss.

According to a particular embodiment, the optical cavity comprises a P-doped region and an N-doped region.

In the latter case, according to a particular embodiment, the optical cavity comprises an undoped gap region arranged between the respectively N-doped and P-doped regions of the optical cavity.

In this case, the quantum wells of the first set and of the second set are respectively arranged in the following way:
the quantum wells of the first set are arranged between the gap region and the P-doped region of the optical cavity, and
the quantum wells of the second set are arranged between the N-doped region and the bottom reflector of the optical cavity.

As such, only the quantum wells of the first set are between the N-doped and P-doped region, which are those between which the electrical injection is produced. The quantum wells of the second set are not between these regions and therefore are not pumped electrically. The wells of the first set, pumped electrically, will as such generate exciton-polaritons wherein the wells of the first and of the second set participate equally, which means that the photons emitted by the wells of the first set will be absorbed, then reemitted several times by the wells of the second set before exiting the optical cavity.

According to a particular embodiment, the means of injection include at least one pair of electrical contacts connected to a supply of current.

In the latter case, according to a particular embodiment, a contact of a pair of electrical contacts of the means of injection is fixed to the N-doped region, with the other contact fixed to the P-doped region.

According to a particular embodiment, the optical cavity is deposited on a substrate, which makes it possible to manufacture of the latter the entire cavity.

More preferably, the optical cavity is planar.

More preferably, the optical cavity is arranged in such a way that the light emitted by the system is perpendicular to the transmissive reflector of the optical cavity. This effect can be obtained by having a planar optical cavity, of which all of the comprising elements are flat and parallel to each other.

According to a particular embodiment of the system, the quantum wells of the first and of the second set are constituted of materials coming from the gallium nitride family, which makes it possible to emit a polariton light in ultraviolet around 350 nanometers.

BRIEF DESCRIPTION OF THE DRAWINGS

The invention will be better understood when reading the detailed description of a non-restricted example embodiment, accompanied with figures respectively showing.

DETAILED DESCRIPTION OF PARTICULAR EMBODIMENTS

Figure 1:
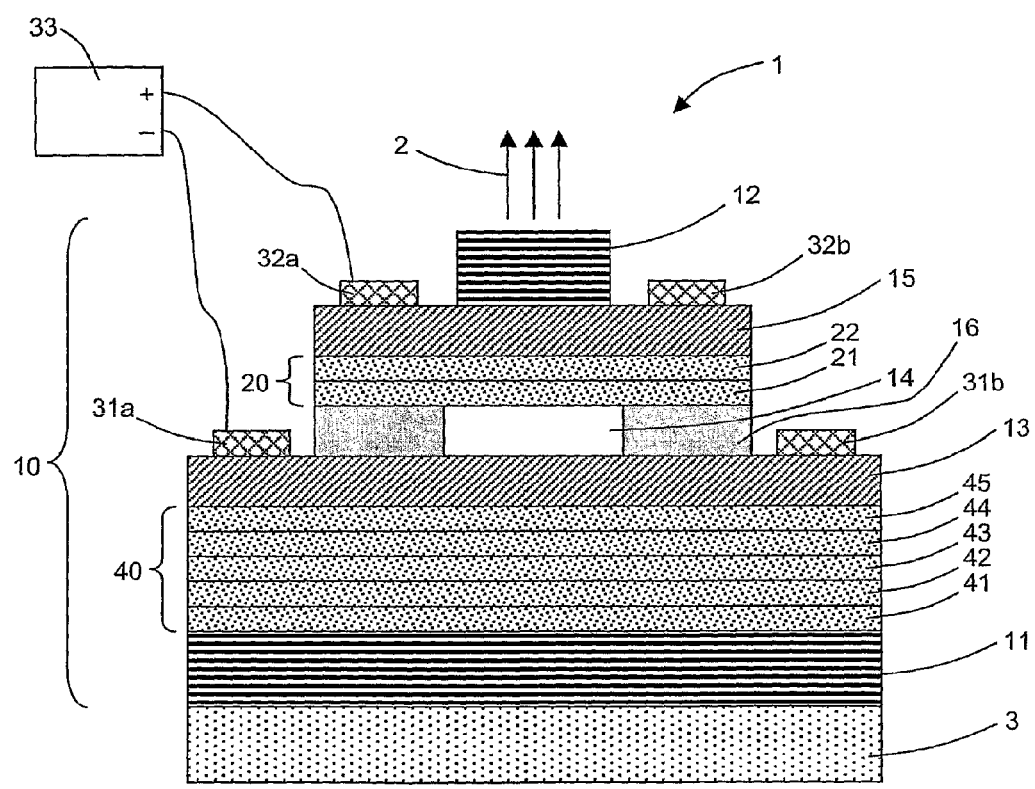
FIG. 1, a diagram of a light emitting system according to a particular embodiment of the invention, and
FIG. 2, a diagram showing the movements of the electrons and of the holes within a light emitting system according to the invention.

As shown in FIG. 1, the system 1 for emitting light 2 according to a particular embodiment of the invention comprises a substrate 3 and an optical cavity 10. It is designed to operate in a specific emission wavelength.

In this embodiment, the system comprises two electrically injected quantum wells 21 and 22 and five non-injected quantum wells 41 to 45. This choice of the number of wells is imposed by the necessity for clarity in the figure. As such, those skilled in the art will be able to choose a more suitable number of quantum wells. In particular, a number of injected wells less than 5 can be chosen and a number of non-injected wells that is clearly higher which could be of a magnitude of 60 for a structure having GaN quantum wells. Those skilled in the art will note indeed that a large total number of quantum wells favors the polariton laser effect.

This system can be obtained according to an epitaxy technique via molecular beam on the substrate 3, which is a technique that is well-known to those skilled in the art. A suitable substrate can be gallium arsenide GaAs, or Sapphire for structures realized with a GaN base.

The optical cavity 10 is a resonant optical micro-cavity having at least one polariton mode, corresponding to an emission of light by spontaneous radiative decay of the polaritons, which is made possible by the finite transmissivity of one of the two reflectors. This cavity comprises, according to this embodiment:
two Bragg reflectors 11 and 12,
regions 13 and 15 respectively N-doped and P-doped,
an undoped gap region 14,
a first set 20 of quantum wells 21 and 22,
means of injection 31 to 33, and
a second set 40 of quantum wells 41 to 45.

The two Bragg reflectors 11 and 12 are arranged respectively on the lower side and on the upper side of the cavity. The bottom reflector 11 is constituted for example of alternating layers $Al_{0.85}In_{0.15}N$ and AlGaN, of which the realization is described for example in American Patent application US 2007/003697, or of alternating layers of $Al_{0.58}Ga_{0.22}N$ and $Al_{0.20}Ga_{0.80}N$. The top reflector is constituted for example of alternating $SiO_2$ and SiN dielectric layers. These alternating layers are shown in FIG. 1 by successions of white and black bands. Each of these alternating layers has a thickness equal to a quarter of the wavelength of the light 2 emitted.

These two reflectors 11 and 12 are designed to reflect the light at the emission wavelength of the laser. The top reflector 12 moreover has transmissive properties so that the light 2 emitted by the system can exit from the latter by passing through this reflector 12. Transmissive reflector here means a reflector having a finite transmissivity in such a way that a portion of the light emitted can pass through it.

These Bragg reflectors have the advantage of generating little loss of energy. Nevertheless, according to other embodiments, it can be considered to replace these Bragg reflectors 11 and 12 with other types of reflectors.

Between the bottom 11 and top 12 Bragg reflectors, the optical cavity 10 comprises a set of intermediate layers. These layers are successively the quantum wells 41 to 45 of the second set, the N-doped region 13, the undoped gap region 14, the quantum wells 21 and 22 of the first set and the P-doped region 15.

Preferably, all of the layers and elements of this system are planar and parallel to each other. It is also ensured that the output light 2 will be emitted in a direction perpendicular to the reference plane of the system.

The N-doped region 13 consists of an N-doped AlGaN layer. Likewise, the P-doped region 15 consists of a P-doped AlGaN layer. The undoped gap region 14 is constituted by an opening made in a layer of AlInN. This opening makes it possible to allow the current generated by the means of injection and which passes through a portion of the cavity to pass through. The rest 16 of the AlInN layer forms a tunnel to direct the electrons and the holes in their movements when an electric current is generated.

The quantum wells of the first and of the second set are constituted of a GaN/AlGaN mixture with 20% aluminum and their thickness must be low, of a magnitude of a few atomic monolayers. This proportion of aluminum makes it possible to retain a strong oscillator force for the excitons and to cause the strong coupling regime to exist.

Those skilled in the art will be able to realize the regions 13 to 15 as well as the quantum wells in other suitable materials or alloys without however leaving the scope of this patent. In particular, other mixtures can be realized using gallium nitride in order to realize the quantum wells, such as GaN/InGaN. Gallium nitride has indeed the particularity of allowing an emission in blue or ultraviolet. A mixture with a gallium arsenide base could also be used, such as AlGaAs/GaAs. Other materials can be chosen, in particular according to the emission wavelength desired. Other geometries can be considered.

Moreover, note that the quantum wells can be similar or different. In particular, they can have different geometries and be realized in different materials.

According to other embodiments, the quantum well can have the form of a quantum wire or of a quantum box. Note here that the confinements conferred by a quantum wire, well and box are respectively of one, two and three directions in space. The manufacturing techniques for such quantum structures are known to those skilled in the art.

Figure 2:
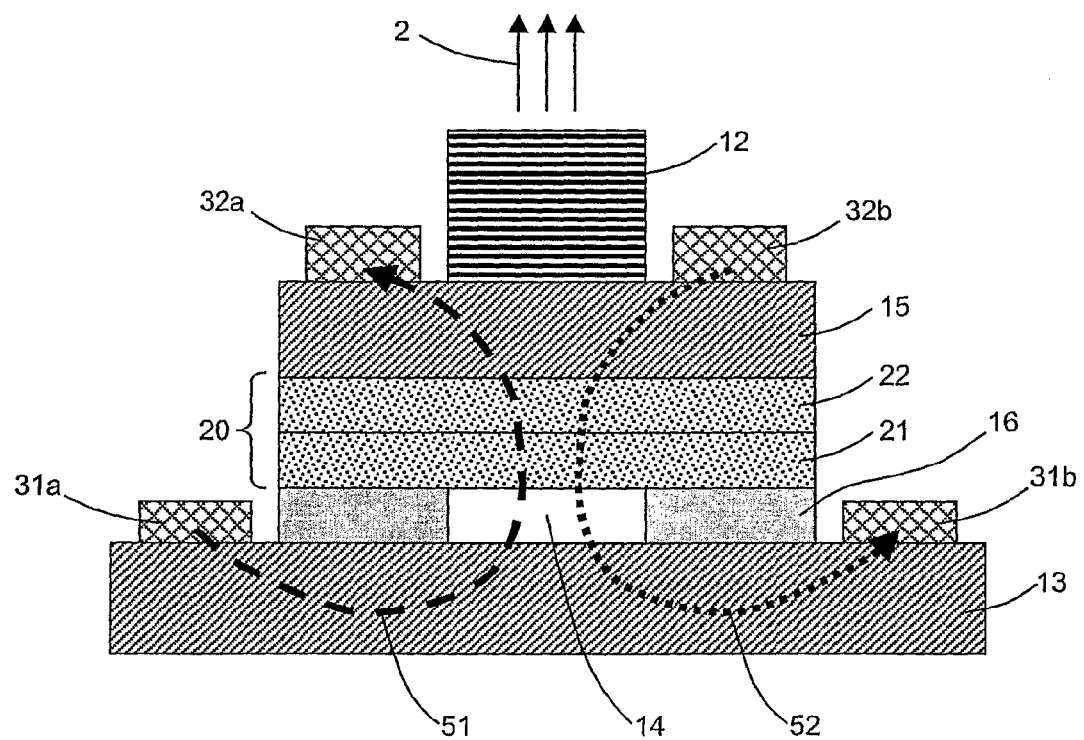

The means of injection 31 to 33 are constituted of several electrical contacts powered by a generator 33. The magnitude of the voltages generated by such a generator is approximately 1.6 to 1.8 Volts, the current passing through the optical cavity 10 thus depending on the dimensions of the surface of this cavity. These electrical contacts operate in pairs (21a, 22a and 21b, 22b). For each pair, a contact 21a (or 21b) is fixed to the N-doped region 13—thus referred to as contact N—and the other contact 22a (or 22b) is fixed to the P-doped region—thus referred to as contact P. The generation of an electric current between the two contacts of the same pair thus causes a displacement of the electrons and of the holes in opposite directions. As shown in FIG. 2, the electrons are displaced from contact N to contact P (arrow 51) and the holes are displaced from contact P to the contact N (arrow 52).

The arrangement of the layers and of the means of injection are such that the quantum wells 21 and 22 of the first set undergo an electrical injection. The quantum wells 41 to 45 of the second set are as such not injected in this way. Moreover, the quantum wells of the first set are arranged in such a way that at least one of their electronic resonances is a strong coupling regime with an optical mode of said optical cavity and emits a light according to a mixed exciton-polariton mode. This arrangement of the quantum wells 21 and 22 is carried out in relation to the means of electrical injection, i.e. between two electrical contacts of the same pair, which makes it possible to emit photons according to a polariton mode of the cavity.

When an electric current passes through the quantum wells of the first set, electrons/excitons and holes come to populate these wells. An electronic/excitonic resonance of each of these wells then occurs in a strong coupling regime with one of the confined polariton modes of the cavity. This strong coupling then results in quasi-particles called exciton-polaritons. These quasi-particles are emitted according to the polariton mode of the cavity.

The quantum wells 41 to 45 of the second set are arranged outside of the direct range of the means of electrical injection and arranged in relation to the quantum wells of the first set in such a way that at least one of their electronic resonances is in a strong coupling regime with said mixed exciton-polariton mode of the optical cavity 10. As such, the quantum wells 41 to 45 of the second set will absorb and then reemit according to a polariton mode of the optical cavity the photons emitted by the quantum wells of the first set. Indeed, the quantum wells are arranged outside the injection zone defined by the electrical contacts 21a and 22a of the means of injection. In addition, the quantum wells 41 to 45 participate in the same polariton mode as quantum wells 21 and 22. As such, these quantum wells 41 to 45 will absorb the photons emitted by the quantum wells 21 and 22 according to the polariton mode. These quantum wells of the second set will then populate excitons to then emit them in the form of photons according to the same polariton mode of the cavity.

In the case where the system is planar and where all of the elements comprising it are parallel to each other, the resulting emission of light coming from the exciton-polaritons will then take place perpendicularly to the upper surface of the cavity, i.e. the upper surface of the upper Bragg reflector 12.

Note here that for an emission of light in polariton mode, the latter has a non-linear dependence in relation to the intensity of the injection (or pumping) electric current.

A light emitting system according to the invention makes it possible to obtain a very high quantum efficiency, this efficiency is defined as the ratio between the number of photons emitted in a given direction and the number of electrons or charge carriers injected.

This system can be used in a large number of applications, for example for applications for the optical storage of data, in particular for DVD players. In the latter case, the use of a system with quantum wells in gallium nitride GaN, emitting in ultraviolet, makes it possible to increase the storage.

The low threshold makes the device low consumption and allows for its use in portable systems (portable computers, etc.) with a better autonomy of the batteries, although the motor also plays a substantial role in the consumption.

Finally, another application that can be considered can consist in integrating such a polariton laser system on microcircuits where the problems of heat dissipation are crucial.

The previously described embodiments of this invention are provided by way of examples and are in no way restricting. It is understood that those skilled in the art are able to realize different alternatives of the invention without however leaving the scope of the patent.

The invention claimed is:

1. Light (2) emitting system (1) comprising an optical cavity (10) having at least one optical mode and comprising:
at least one transmissive reflector (12), a first set (20) of quantum wells (21, 22), and
means (31, 32, 33) of electrical injection of said quantum wells (21, 22) of the first set (20),
said quantum wells (21, 22) of the first set (20) being arranged in such a way that at least one of their electronic resonances is a strong coupling regime with an optical mode of said optical cavity (10) and emits a light (2) according to a mixed exciton-polariton mode,
wherein said optical cavity (10) further comprises a second set (40) of quantum wells (41, 42, 43, 44, 45) arranged outside of the direct range of said means (31, 32, 33) of electrical injection and arranged in relation to said quantum wells (21, 22) of the first set (20) in such a way that at least one of their electronic resonances is in a strong coupling regime with said mixed exciton-polariton mode of said optical cavity (10),
wherein, between a bottom Bragg reflector and a top Bragg reflector, the optical cavity comprises a set of intermediate layers, said intermediate layers being successively said second set of quantum wells, a N-doped region, an undoped gap region, said first set of quantum wells, and a P-doped region, and
wherein said means of electrical injection comprises plural electrical contacts, said electrical contacts operating in pairs, in which for each pair, a first contact of each pair is fixed to the N-doped region and a second contact of each pair is fixed to the P-doped region.

2. System (1) according to claim 1 wherein the light (2) is emitted in the form of a directional and monochromatic light beam.

3. System (1) according to claim 1, wherein the first set (20) comprises a number of quantum wells (21, 22) substantially less than the number of quantum wells (41, 42, 43, 44, 45) of the second set (40).

4. System (1) according to claim 1, wherein the quantum wells (21, 22, 41, 42, 43, 44, 45) of the first (20) and of the second (40) set are identical.

5. System (1) according to claim 1, wherein the optical cavity (10) comprises the bottom Bragg reflector (11) and the top Bragg reflector (12) arranged respectively at the lower and upper ends of said optical cavity (10), said top reflector (12) being transmissive in such a way that the light (2) emitted by the system (1) passes through said top reflector (12).

6. System (1) according to claim 1, wherein the quantum wells (21, 22) of the first set (20) are arranged between the gap region (14) and the P-doped region (15) of the optical cavity (10).

7. System (1) according to claim 2, wherein at least one pair (31a, 32a) of said electrical contacts are connected to a supply (33) of current.

8. System (1) according to claim 1, wherein the optical cavity (10) is deposited on a substrate (3).

9. System (1) according to claim 1, wherein the optical cavity (10) is planar.

10. System (1) according to claim 1, wherein the optical cavity (10) is arranged in such a way that the light (2) emitted by said system (1) is perpendicular to the transmissive reflector (12) of said optical cavity (10).

11. System (1) according to claim 1, wherein the quantum wells (21, 22, 41, 42, 43, 44, 45) of the first (20) and of the second (40) set are constituted of materials coming from the gallium nitride family.

12. System (1) according to claim 1, wherein at least one pair (31a, 32a) of said electrical contacts are connected to a supply (33) of current.

13. Light (2) emitting system (1) comprising:
an optical cavity (10) having at least one optical mode and comprising at least one transmissive reflector (12),
a first set (20) of quantum wells (21, 22), and
means (31, 32, 33) of electrical injection of said quantum wells (21, 22) of the first set (20),
said quantum wells (21, 22) of the first set (20) being arranged in such a way that at least one of their electronic resonances is a strong coupling regime with an optical mode of said optical cavity (10) and emits a light (2) according to a mixed exciton-polariton mode,
wherein said optical cavity (10) further comprises a second set (40) of quantum wells (41, 42, 43, 44, 45) arranged outside of the direct range of said means (31, 32, 33) of electrical injection and arranged in relation to said quantum wells (21, 22) of the first set (20) in such a way that at least one of their electronic resonances is in a strong coupling regime with said mixed exciton-polariton mode of said optical cavity (10),
wherein the optical cavity (10) comprises a P-doped region (13) and an N-doped region (15),
wherein the optical cavity (10) comprises an undoped gap region (14) arranged between the regions (13, 15) respectively N-doped and P-doped of the optical cavity (10), and
wherein the quantum wells (21, 22) of the first set (20) are arranged between the gap region (14) and the P-doped region (15) of the optical cavity (10).

14. Light (2) emitting system (1) comprising:
an optical cavity (10) having at least one optical mode and comprising at least one transmissive reflector (12),
a first set (20) of quantum wells (21, 22), and
means (31, 32, 33) of electrical injection of said quantum wells (21, 22) of the first set (20),
said quantum wells (21, 22) of the first set (20) being arranged in such a way that at least one of their electronic resonances is a strong coupling regime with an optical mode of said optical cavity (10) and emits a light (2) according to a mixed exciton-polariton mode,
wherein said optical cavity (10) further comprises a second set (40) of quantum wells (41, 42, 43, 44, 45) arranged outside of the direct range of said means (31, 32, 33) of electrical injection and arranged in relation to said quantum wells (21, 22) of the first set (20) in such a way that at least one of their electronic resonances is in a strong coupling regime with said mixed exciton-polariton mode of said optical cavity (10),
wherein the optical cavity (10) comprises a P-doped region (13) and an N-doped region (15),
wherein the means (31, 32, 33) of injection include at least one pair (31a, 32a) of electrical contacts connected to a supply (33) of current, and
wherein a contact (31a) of one pair (31a, 32a) of electrical contacts of the means (31, 32, 33) of injection is fixed to the N-doped region (13), the other contact (32a) being fixed to the P-doped region (15).

* * * * *

UNITED STATES PATENT AND TRADEMARK OFFICE
CERTIFICATE OF CORRECTION

PATENT NO. : 8,498,318 B2  Page 1 of 1
APPLICATION NO. : 13/128765
DATED : July 30, 2013
INVENTOR(S) : Malpuech et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 129 days.

Signed and Sealed this

Fifteenth Day of September, 2015

Michelle K. Lee
*Director of the United States Patent and Trademark Office*